United States Patent [19]

Shaw et al.

[11] Patent Number: 5,150,309

[45] Date of Patent: Sep. 22, 1992

[54] COMPREHENSIVE LOGIC CIRCUIT LAYOUT SYSTEM

[75] Inventors: Ching-Hao Shaw, Plano; Patrick Bosshart, Dallas; Douglas Matzke, Plano; Vibhu Kalyan, Dallas; Theodore Houston, Richardson, all of Tex.

[73] Assignee: Texas Instruments Incorporated, Dallas, Tex.

[21] Appl. No.: 546,080

[22] Filed: Jun. 29, 1990

Related U.S. Application Data

[63] Continuation of Ser. No. 336,957, May 18, 1989, abandoned, which is a continuation of Ser. No. 081,419, Aug. 4, 1987, Pat. No. 4,870,598.

[51] Int. Cl.⁵ .............................................. G06F 15/20
[52] U.S. Cl. ...................................... 364/491; 364/488
[58] Field of Search ................ 364/488, 489, 490, 491

[56] References Cited

U.S. PATENT DOCUMENTS

| | | | |
|---|---|---|---|
| 3,681,782 | 8/1972 | Scanlon | 364/491 X |
| 3,753,005 | 8/1973 | Bertram et al. | 357/46 X |
| 3,956,641 | 5/1976 | Berger et al. | 357/46 X |
| 3,987,287 | 10/1976 | Cox et al. | 364/712 |
| 4,053,336 | 10/1977 | Grundy et al. | 357/46 X |
| 4,212,026 | 7/1980 | Balasubramanian et al. | 357/46 X |
| 4,288,805 | 7/1981 | Depey | 357/46 X |
| 4,523,106 | 6/1985 | Tanizawa et al. | 364/490 X |
| 4,584,653 | 4/1986 | Chih et al. | 364/491 |
| 4,591,993 | 5/1986 | Griffin et al. | 364/491 |
| 4,602,270 | 7/1986 | Finegold et al. | 357/46 X |
| 4,602,339 | 7/1986 | Aihara et al. | 364/491 X |
| 4,615,011 | 9/1986 | Linsker | 364/491 |
| 4,649,497 | 3/1987 | Carlson et al. | 364/491 |
| 4,668,880 | 5/1987 | Shoji | 364/488 X |
| 4,689,502 | 8/1987 | Shimauchi et al. | 364/490 X |
| 4,701,778 | 10/1987 | Aneha et al. | 357/46 X |
| 4,745,084 | 5/1988 | Rowson et al. | 364/491 X |
| 4,845,633 | 7/1989 | Furtek | 364/490 |
| 4,870,598 | 9/1989 | Shaw et al. | 364/491 |
| 4,896,272 | 1/1990 | Kurosawa | 364/491 |
| 4,931,946 | 6/1990 | Ravindra et al. | 364/490 |
| 4,949,275 | 8/1990 | Nonaka | 364/490 |

OTHER PUBLICATIONS

Large Scale Integration of MOS Complex Logic: A Layout Method, vol. SC-2, No. 20, Dec. 1967, p. 182, IEEE Journal of Solid-State Circuits, Arnold Weinberger.

22nd Design Automation Conference, SWAMI: A Flexible Logic Implementation System, Christopher Rowen and John L. Hennessy, p. 169, Paper 13.2.

AT&T CMOS Digital Circuit Technology, Masakazu Shoji, p. 221, 5.6 Domino CMOS Dynamic Logic.

20th Design Automation Conference, Pleasure: A Computer Program for Simple/Multiple Constrained/Unconstrained Folding of Programmable Logic Arrays, Giovanni De Micheli and Alberto Sangiovanni-Vincentelli, p. 263, 1983.

Primary Examiner—Parshotam S. Lall
Assistant Examiner—Edward R. Cosimano
Attorney, Agent, or Firm—W. James Brady, III; Lawrence J. Bassuk; Richard L. Donaldson

[57] ABSTRACT

Random logic circuitry (210) is laid out in a logic array (212) that has a plurality of row and column locations. The logic circuitry (210) implements a plurality of dynamic logic circuits, each logic circuit having a plurality of logic gate field effect transistors (224) each formed at a selected intersection of one of the row locations and one of the column locations. Elongate gate conductors (e.g., G, H, I) are formed at selected row locations in the logic array (212), each gate conductor provided as a gate for one or more of the logic gate transistors (224). A plurality of elongate second conductors (222) connect to selected ones of the sources or drains of the transistors (224) and to non-Boolean portions of the dynamic logic circuits. The non-Boolean portions are formed in an adjacent tile section (214) in the semi-conductor layer separate from the logic array (212).

2 Claims, 6 Drawing Sheets

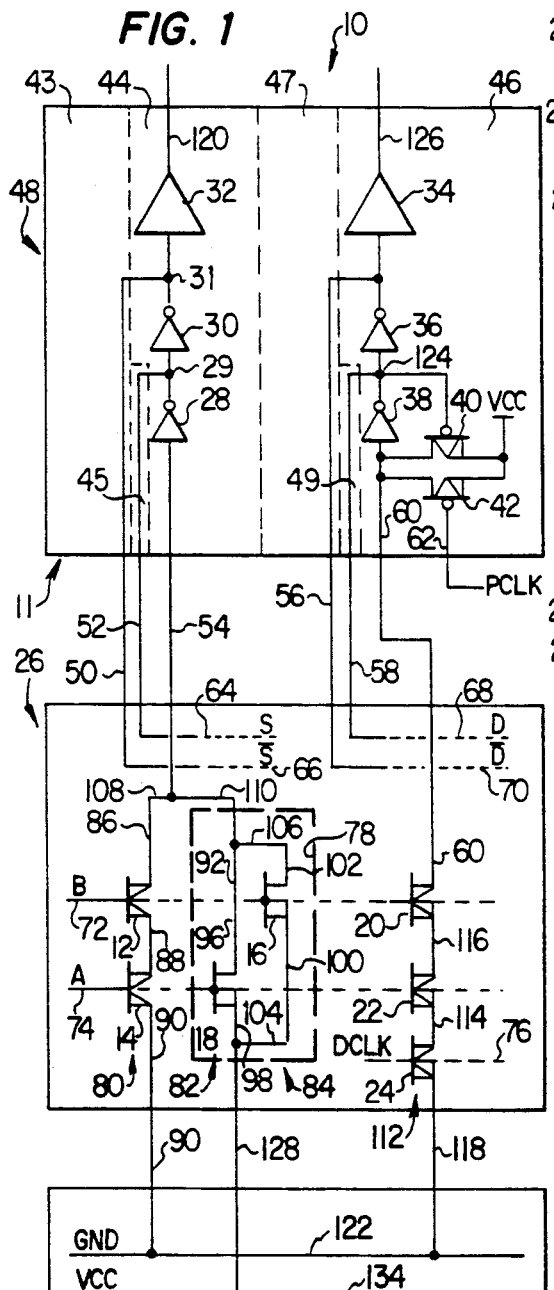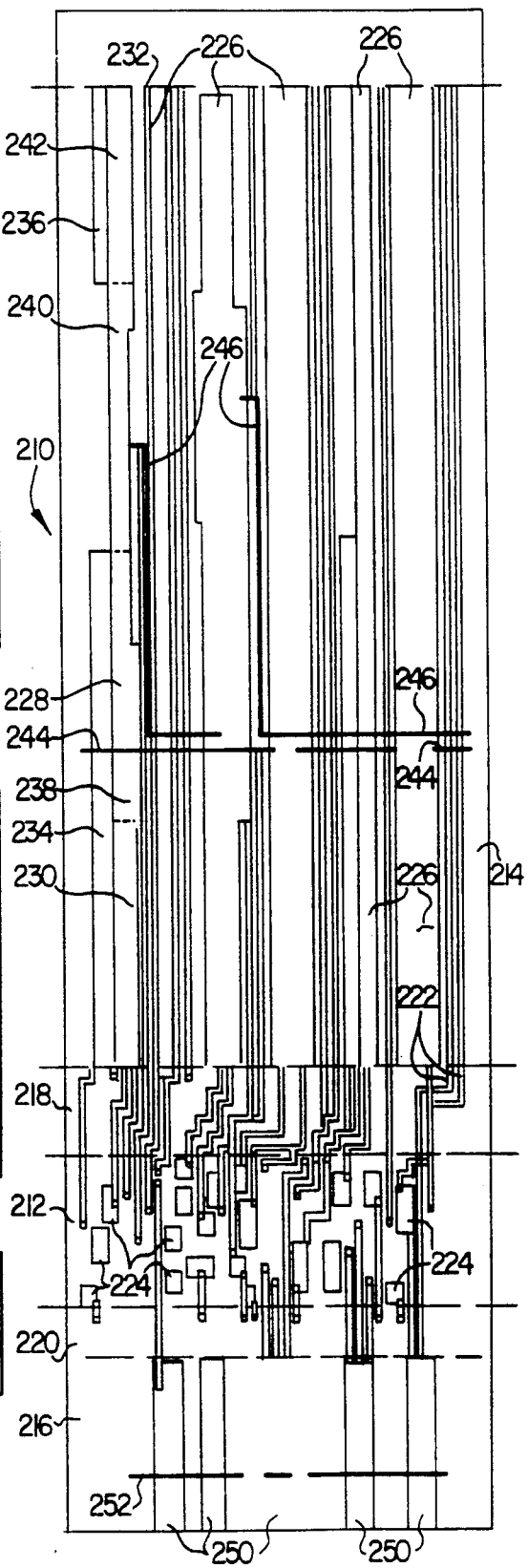

FIG. 3

```
DEFLOGIC    ⌐170   ⌐172
   DEFLATCH AL
      (PH2) (/BX) (//CX) (DX) (//EX) (FX) (//GX) (HX) (IX)
                        ⌐176
   DEFLATCH J-
      (PH1RUN) ((//KL)+(LL)) (//ML)
                              ⌐187
   DEFLATCH KL
      (PH2) (N)
   DEFEQN L-  ⌐178
      (P) (//G) (//FX)
   DEFEQN L-  ⌐180
      (//L)
   DEFLATCH LL  ⌐190
      (PH2) (L)
   DEFREGISTER Q-  ⌐182
      (PH1RUN) ((R)+(J)) ((Q+(V))
   DEFCLOCK V-  ⌐184
186⌐ (PH1) (((//ML)(ML)+(PH1SCAN)(YSCAN))
   DEFCLOCK Z
      (PH1SCAN) (AASCAN)
   DEFCLOCK AE
      (PH1) (((//ML) (AL)+(PH1SCAN)(AGSCAN))
   DEFCLOCK AH
      (PH1RUN) ((//I)+(//F))(//J)(AJ)(Q)
   DEFCLOCK AJ
      (PH2)((I)(H)(G)+(PH2SCAN)(AASCAN))
   DEFCLOCK AM
      (PH2)((//I)(H)(G)+(PH2SCAN)(AGSCAN))
   DEFSCANADDRREG AASCAN
      (Z)    ⌐188
   DEFSCANADDRREG AGSCAN
   DEFEQN AN
      (F)+(I)
   OUTPUT TERMS
      AE  AM  AV  Z  AJ  ML  AW  J  AN  AX  AY  AZ
      BA  AI  AH  Q  U   BB  BC
   REQUIRED INPUTS
      P   IX  HX  I  H  G  F  E  D  C  AI  BA
      N   R   BD  PH1SCAN PH1RUN PH2 PH2SCAN A  U
      ML  PH1
```

FIG. 4b

```
0  2PH2
1  10//F 24P
2  12 PH1RUN 20//FX
3  2J 24//G
4  2R 10//H
5  0//KL 18G
6  3U 11//J 18H
7  3Q 13LL 25I
8  8//ML 22F
9  7AI 17AL
10
11
12
13
14
15 1N
```

```
                                              COLUMN
             ROW OR TRACK NUMBER              NUMBER
 0  1  2  3  4  5  6  7  8  9 10 11 12 13 14 15   ↓
 -  -  -  -  -  0  -  -  -  -  -  -  -  -  -  -   0  KL    NIL FDBK-NIL
 -  -  -  -  -  !  -  -  -  -  -  -  -  -  -  1   1  N     DEFLATCH NIL
 1  -  -  1  1  !  -  -  -  -  -  -  -  -  -  !   2  Q     DEFREGISTER OUT FIRST-OR-TERM
 !  -  -  !  1  !  1  1  -  -  -  -  -  -  -  !   3  Q     DEFREGISTER OUT OR-TERM
 !  -  -  !  !  !  !  1  -  -  -  -  -  -  -  !   4  Q     NIL FDBK-TRUE
 !  -  -  !  I  1  !  !  -  -  -  -  -  -  -  !   5  R     TRUE FROM-TOP
 !  -  -  !  -  !  I  !  -  -  -  -  -  -  -  !   6  U     TRUE FROM-TOP
 !  -  -  !  -  !  -  !  1  -  -  -  -  -  -  !   7  AI    TRUE FROM-TOP
 !  -  -  !  -  !  -  !  0  !  -  -  -  -  -  !   8  ML    NIL NIL NIL-FROM-BOTTOM CBINV
 !  -  -  !  -  !  -  !  !  !  -  -  -  -  -  I   9  N     TRUE FROM-TOP
 1  0  -  !  0  !  -  !  !  !  -  -  -  -  -  -  10  AH    DEFCLOCK OUT FIRST-OR-TERM
 !  !  -  !  !  !  0  !  !  !  -  -  -  -  -  -  11  AH    DEFCLOCK OUT LAST-AND-TERM
 !  !  !  !  !  0  !  -  !  !  -  -  -  -  -  -  12  J     DEFLATCH OUT
 !  !  !  !  !  -  !  1  0  !  -  -  -  -  -  -  13  J     DEFLATCH OUT
 !  !  !  !  !  -  0  !  !  !  -  -  -  -  -  -  14  J     NIL FDBK-NIL
 !  !  !  I  !  -  -  !  !  !  -  -  -  -  -  -  15  J     NIL FDBK-TRUE
 !  !  1  -  !  -  -  !  !  !  -  -  -  -  -  -  16  PH1RUN RUN TRUE TRUE-FROM-BOTTOM
 !  !  I  -  !  -  -  !  0  1  -  -  -  -  -  -  17  AE    DEFCLOCK OUT
 1  !  -  -  0  1  1  !  -  !  -  -  -  -  -  -  18  AM    DEFCLOCK OUT
 !  !  -  -  !  !  !  !  -  I  -  -  -  -  -  -  19  A     TRUE FROM-TOP
 !  !  0  -  !  !  !  !  -  -  -  -  -  -  -  -  20  F     FX NIL CBREG CBINV
 !  0  !  -  !  !  !  !  1  -  -  -  -  -  -  -  21  F     NIL NIL-FROM-BOTTOM CBINV
 !  -  !  -  !  !  !  !  !  -  -  -  -  -  -  -  22  F     TRUE FROM-TOP
 !  -  !  -  !  !  !  I  !  -  -  -  -  -  -  -  23  LL    NIL FDBK-TRUE
 !  1  0  0  !  !  !  -  !  -  -  -  -  -  -  -  24  L     DEFEQN LATCH
 !  !  -  !  !  !  !  !  1  I  -  -  -  -  -  -  25  AN    DEFEQN OUT FIRDT-OR-TERM
 !  !  -  0  !  !  !  !  -  -  -  -  -  -  -  -  26  C     NIL NIL-FROM-BOTTOM CBINV
 !  !  -  -  !  1  !  !  -  -  -  -  -  -  -  -  27  C     TRUE FROM-TOP
 !  !  -  -  !  !  1  !  -  -  -  -  -  -  -  -  28  P     TRUE TRUE-FROM-BOTTOM
 !  -  -  -  !  !  !  -  -  -  -  -  -  -  -  -  29  Z     DEFCLOCK OUT
 1  -  -  -  !  !  1  -  -  -  -  -  -  -  -  -  30  AJ    DEFCLOCK OUT
 !  -  -  -  !  !  !  -  -  -  -  -  -  -  -  -  31  I     NIL NIL-FROM-BOTTOM CBINV
 !  -  -  -  0  -  !  I  -  -  -  -  -  -  -  -  32  I     TRUE FROM-TOP
 I  -  -  -  -  -  !  -  -  -  -  -  -  -  -  -  33  PH2   TRUE TRUE-FROM-BOTTOM
 -  -  -  -  -  -  I  -  -  -  -  -  -  -  -  -  34  H     TRUE FROM-TOP
```

*FIG. 4a*

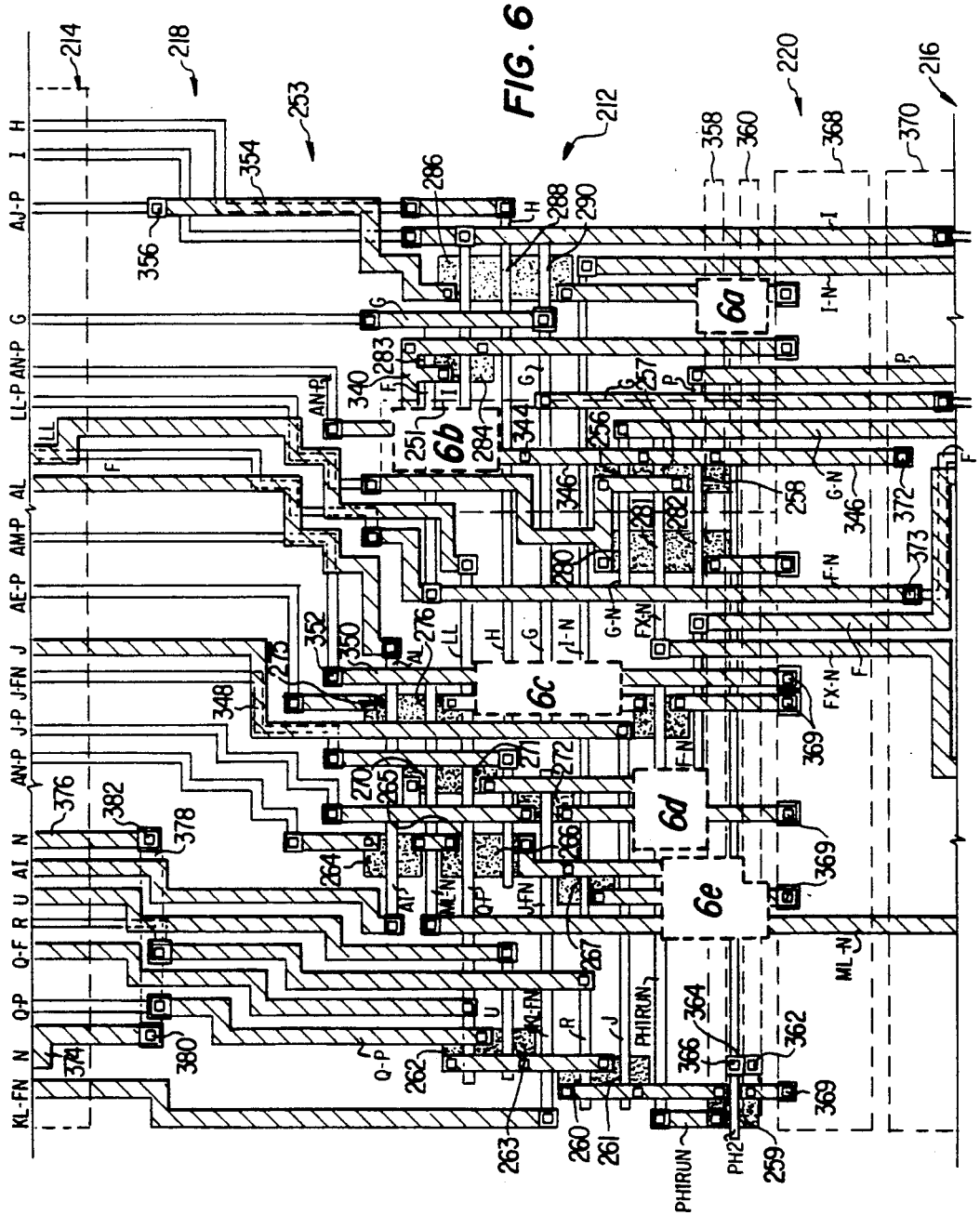

COMPREHENSIVE LOGIC CIRCUIT LAYOUT SYSTEM

This is a continuation of application Ser. No. 07/336,957, filed May 18, 1989, now abandoned, which is a continuation of application Ser. No. 07/81,419, filed Aug. 4, 1987, now U.S. Pat. No. 4,870,598.

TECHNICAL FIELD

This invention relates in general to the synthesis and layout of logic circuitry, and more particularly relates to a method and system for synthesizing the layout of dynamic or control logic circuitry in a monolithic integrated circuit.

BACKGROUND OF THE INVENTION

A high degree of circuit irregularity exists in the control sections of microprocessor units. Various strategies have been used in the past to automate the layout of these control sections as much as possible. Standard cell design styles and programmable logic arrays (PLAS) are two conventional approaches. The standard cell design style is however in general restricted to static gates, and further has a relatively poor density in the finalized design due to large routing area.

All conventional standard cells are fabricated using static CMOS gates. It would be impossible or highly impractical to fabricate dynamic domino logic using them, although standard cells can be used to fabricate registers and state machines. Even here, the standard cell approach suffers from low layout design densities and relatively poor speed and timing performance.

The PLA design style does not allow the free mix of static and dynamic gates without a large cost penalty in terms of layout area.

Another design style is the Weinberger array, as pioneered by A. Weinberger in "Large Scale Integration of MOS Complex Logic," *IEEE Solid State Circuits*, Vol. SC-II, pp. 182-190 (December, 1967). A Weinberger array comprises a plurality of elongate gate regions formed at a face of a semiconductor substrate, and interconnected by a plurality of conductors running orthogonally to the gate regions.

Recently, the Stanford Weinberger Array Minimizer and Implementor (SWAMI) logic design system has been disclosed in C. Rowen and J. Hennessy, "SWAMI: A Flexible Logic Implementation System," *IEEE Twenty-second Design Automation Conference*, pp. 169-175 (1985). The SWAMI logic implementation system generates multi-level logic expressions from an algorithmic description of a combinational function. The combinational function includes NAND and NOR expressions. The SWAMI Weinberger implementation is however limited to NMOS technology. Further, the Weinberger array methodology does not allow the mixture of dynamic and static gates, and is unable to incorporate such circuit structures as buffers or registers.

U.S. Pat. No. 4,319,396 issued to Law et al. discloses a gate-matrix method for fabricating insulated gate field-effect transistor (IGFET) circuits, wherein a plurality of static gate transistors are formed at selected intersections of rows and columns in an array, each row having a single gate conductor and each column forming vertical borders for the transistor source and drain regions formed therein. The columns are spaced from each other to provide spacing between horizontally adjacent transistors. A plurality of vertical conductors make connection to the source and drain regions and are insulatively spaced from the gate conductors. Law et al. however show only a logic array that is not capable of implementing dynamic logic functions.

Therefore, a need has arisen in the industry for a logic layout synthesis system that can implement functions with such non-Boolean components as dynamic domino gates, registers, buffers and precharge clocks with good final design density.

SUMMARY OF THE INVENTION

One aspect of the invention comprises logic circuitry including a plurality of logic circuits having Boolean portions and non-Boolean portions. The logic circuits are preferably described in RTL equations. The logic circuitry is formed at a face of the semiconductor layer, and comprises a logic array having a plurality of rows and columns. Gate transistors of the Boolean portions are formed at selected intersections of the rows and columns. A tile section is formed at the face of the semiconductor layer and comprises a plurality of tiles, each tile comprising a non-Boolean portion of a logic circuit. Conductors are used to couple the Boolean portions of the logic circuit to the non-Boolean portions thereof.

A principal advantage of the invention inheres in its design style, in which transistors of random Boolean expressions are formed in a logic array and custom designed tiles for the different logic circuits are formed in a separate tile section.

Preferably, the conductors connecting the Boolean portions to the non-Boolean portions comprise a plurality of river-routed conductors. The conductors are preferably formed on multiplelayers such that track density is maximized and the river routing section is of minimum height.

In another aspect of the invention, the logic circuitry includes a plurality of dynamic logic circuits each having non-Boolean circuit elements. Each dynamic logic circuit has a plurality of logic gate transistors that are each formed at a selected intersection of a row location and selected adjacent column locations in an array. A plurality of elongate gate conductors are formed at selected row locations or tracks in the array, with each gate conductor insulatively disposed over at least one of the logic gate transistors. A plurality of elongate second conductors are formed for coupling together the current paths of selected logic gate transistors. The second conductors further couple the array to non-Boolean elements of the dynamic logic circuits. Preferably, in the instance where several logic equations are implemented that use the same input signal or operand, a single gate conductor is provided that carries the value of the input signal and is used to gate respective gate transistors of each logic equation using the operand.

Another aspect of the invention comprises a plurality of tiles for the non-Boolean portions which are formed in a second portion of the semiconductor substrate separate from the regular logic array. The tiles are elongate and each present an end toward the columns of the logic array. The tiles are laid out in a columnar order that matches the columnar order of the Boolean portions of the logic equations as implemented into the logic array. This aspect of the invention provides a technical advantage in that the logic array and the tile section are tightly integrated with a river router. Further, the elongate shape of the tiles inside the tile section helps the tile section match as closely as possible the horizontal width of the logic array.

Another aspect of the invention comprises a method for laying out a plurality of logic circuits on a face of a semiconductor layer. According to this method, a Boolean portion of each logic circuit is mapped into a logic array on the face, the array having a plurality of rows and columns. The Boolean portion comprises at least one logic gate transistor formed at an intersection of one of the rows and one of the columns. Then, a non-Boolean portion of each logic circuit is implemented in a respective tile. The tile is placed in a tile section on the face near the logic array. Finally, a non-Boolean portion of each logic circuit is coupled with its respective Boolean portion.

Another aspect of the invention inheres in a design system that is able to derive a logic layout from input RTL equations. RTL equations define logic functions according to several types, including functions requiring one or more latches or dynamic domino gates. A computational method according to the invention is able to recognize each of these equation types and select appropriate non-Boolean circuitry for each. Thus, the input data can be more advanced and abstract than the prior art net list equations.

According to a further aspect of the invention, if any tile outputs an intermediate signal that is used as an input signal by other logic gates, the intermediate signal is fed back to the logic array on a conductor adjacent the tile. This arrangement is highly advantageous when compared to intermediate feedback signals in PLA layouts, which need to be routed half way around the layout perimeter.

In another aspect of the invention, the above method further includes the step of optimizing the logic array for dimensional compactness. The step of optimization preferably includes assigning an arbitrary row or track order to each of the input signals in the Boolean portions, one input signal per track, and assigning an initial columnar order to each of the Boolean portions. A cost function is preferably calculated for the present columnar order, based on criteria including logic array compactness. The Boolean portions are then reordered in a new columnar order, and the cost function is recalculated. The new columnar order is adopted as the present columnar order if its cost function has a better value, and is otherwise rejected. The steps of reordering, recalculating and adopting are repeated unitl a satisfactory cost function value is achieved. Preferably, the step of ordering is performed by a pairwise exchange heuristic.

The optimization aspect of the invention provides a technical advantage in that a compact logic array is achieved. One of the criteria that may be used in determining the cost function is the length of the gate conductors used to implement the logic array. Another is the degree from which the resultant order of primary inputs and outputs on the periphery of the logic circuitry differs from the optimum primary I/O order. Preferably, both of these criteria are used in optimizing the logic array structure.

In another aspect of the invention, the logic array may be horizontally folded after the columnar order of the Boolean portions of the logic expressions has been optimized. In folding, an array in which each gate conductor is accorded its own row location or track is compacted as much as possible such that two or more gate conductors may share a single track. This provides a shortened dimension of the logic array in the columnar direction.

A principal advantage of the above method is the ability of the implementation system to design non-static logic, and further, to freely mix static and non-static logic functions in accordance to a cost function.

Another advantage of the invention is the relatively compact design produced, which design is moreover free from design flaws. Inside the Boolean logic array, the transistors and connections thereto may all be standardized according to design rules. For the non-Boolean elements, customized tile or register sections are used that have been previously designed and tested.

BRIEF DESCRIPTION OF THE DRAWINGS

Further aspects of the invention and their advantages will be ascertained with reference to the following detailed description in conjunction with the drawings in which:

FIG. 1 is a schematic electrical circuit and layout diagram showing a preferred layout topology employed by the invention;

FIG. 3 is a listing of logic equation inputs used by an automated program according to the invention to generate exemplary control logic circuitry;

FIGS. 4a and 4b are listings of logic equations and their input signals showing a final two-dimensional symbolic array after logic array optimization and folding;

FIG. 5 is a schematic block diagram of a completed exemplary layout according to the invention, showing a logic array section, a lower tile section, an upper tile section and river routing therebetween, all as generated from the symbolic array shown in FIGS. 4a and 4b;

FIG. 6 is a detailed magnified schematic plan view of the random logic array section and river-routing sections shown in FIG. 5;

DETAILED DESCRIPTION

Figure 7:
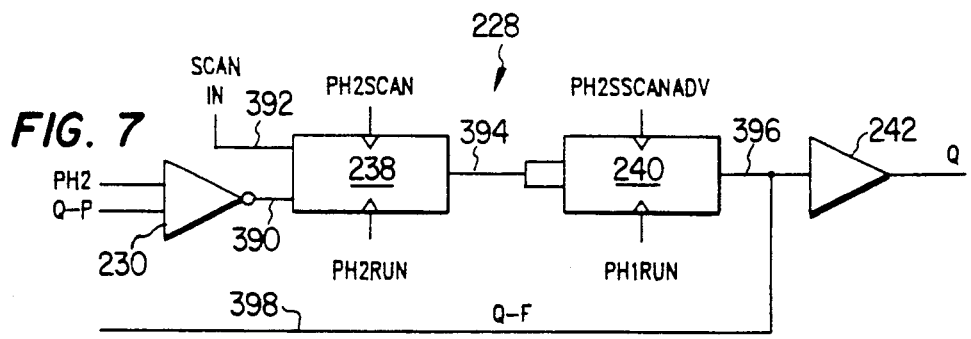
FIG. 7 is an electrical circuit block diagram of a non-Boolean logic tile incorporated into the tile section shown in FIG. 5.

FIG. 1 is a part-electrical, part-physical schematic diagram of a general layout topology according to the invention. An extremely simplified logic circuit is indicated generally at 10. Logic circuit 10 has been implemented at a face of a semiconductor layer 11. Circuit 10 implements a static gate logic equation $S=AB$, and an analogous dynamic gate logic equation $D=AB$. A plurality of logic gate transistors 12-24 are laid out in a regular manner in a random logic array section 26, and a plurality of related non-Boolean elements 28-42 are formed in a plurality of tiles 43-47 and 49 within a tile section indicated generally at 48. Tiles 43-47 and 49 are connected to selected points in the random logic array 26 by a plurality of river-routed conductors 50-62.

The general organization of logic array section 26 is as follows. For the inputs signals or operands A and B of logic equations S and D, and for feedback and clock functions, a plurality of horizontal gate conductors 64-76 are disposed in a plurality of predetermined rows or tracks in the array. The gate conductors 64-76, which preferably are comprised of polycrystalline silicon, are disposed adjacent diffused regions (not shown) that are formed at selected columnar indices in the array. The diffused regions are shaped and sized according to predetermined design rules.

At each of these intersections a transistor is formed, such as transistors 12-24. Both n-channel transistors, such as transistors 12, 14, 20, 22 and 24, and p-channel transistors, such as transistors 16 and 18, can be formed within array 26. The illustrated embodiments shown in FIGS. 1, 6, 6a-6e and 8 are for CMOS technology, although NMOS or PMOS technology could also be used. Where the basic conductivity type of the semiconductor substrate is p-type, the p-channel transistors 16 and 18 are formed in an n-tank 78.

In general, the gate transistors making up any particular logic function, such as transistors 12 and 14, are disposed wherever possible in columnar relation to each other. Boolean portions of the logic equations are mapped into the array in a left-to-right order. In this extremely simple case, a Boolean circuit for equation S is disposed generally in the left side of the array 26, and a Boolean circuit for dynamic AND logic equation D is disposed generally on the right hand side of array 26.

Although the gate transistors of the logic equations are in general vertically disposed in relation to each other, many, if not most, of the implemented Boolean logic circuits will take up several columnar indices of space. Thus, for expression S, a pair of n-type transistors 12 and 14 are disposed in a first column indicated generally at 80. A p-channel transistor 18 is disposed in a second column indicated generally at 82, and a further p-channel transistor 16 is disposed in yet another column 84. A preferred automated layout-generating computer program responsible for generating the layout further takes into account additional columnar spacing requirements imposed by n tank 78.

The transistors occupying various columns 80-84 of logic expression S are connected together by conductors 86-100 that run on a different level than, and are substantially orthogonal to, conductors 72 and 74. In the illustrated embodiment, conductors 86-100 are formed from elongate strips of first metal that are usually insulatively spaced over polysilicon conductors 72 and 74, as by a layer of interlevel oxide.

In each transistor diffused region, vias are made to the semiconductor substrate for the connection of first metal conductors on either side of the gate conductor. Although conductors 86-100 are disposed vertically in specified columnar indices, the computer program that embodies the preferred design process of the invention will make horizontal connections in the first metal based on the logic expression involved. Examples of such horizontal first metal connections are horizontal conductor segments 104, 106, 108 and 110.

Logic expression D is of the dynamic domino type, wherein the first metal conductors are first precharged by a precharge clock located in tile 46, and then are discharged depending on the presence or absence of signals on gate conductors 72 and 74. Dynamic logic expression D is implemented by a plurality of transistors 20-24 that are in this instance disposed at a single columnar index indicated generally at 112. First metal conductors 114 and 116 interconnect the current paths of transistors 20-24 in series. A river-routed conductor 60 connects a drain of transistor 20 to circuitry tile 46, and a further first metal conductor 118 connects a source of transistor 24 to ground. Transistor 24 implements a discharge clock DCLK of expression D within logic array 26, while a precharge clock of expression D is implemented within the corresponding tile 46.

The non-Boolean components implementing logic expressions S and D are placed in respective custom-designed tiles 44 and 46 within tile section 48. For static logic expression S, a river-routed conductor 54 connects to the logic matrix circuit portion of expression S to the input of inverter 28. The output of inverter 28 is connected to a node 29, which in turn is connected to the input of an inverter 30. The output of inverter 30 is connected to a node 31, which in turn is connected to the input of a buffer 32. Buffer 32 outputs a buffered output signal S on an output conductor 120.

The river routing technique also allows the feedback of signals S and $\overline{S}$ from nodes 29 and 31 on feedback conductors 52 and 50 respectively. Thus, the result of a logic operation on input signals A and B can be fed back into logic array 26 for further operations. The signal feedback conductors 50, 52, 56 and 58 are part of a preplanned routing scheme and are disposed adjacent the circuitry making up tiles 44 and 46. The design technique of the invention allows the reintroduction of the feedback signals into logic array 26 without routing the conductors half way around the array to some input section, as is the case for the PLA design technique. River-routed conductors 50 and 52 make appropriate connections to gate conductors 64 and 66, which make S and $\overline{S}$ available as input signals for further logic expressions.

Expression D evaluates the NAND of input signals A and B, but does it with a dynamic domino circuit. The source region of transistor 24 is connected by a vertical first metal conductor 118 to a ground line 122. A p-channel precharge clock transistor 42 is formed within tile 46. This transistor energizes conductor 60 as long as the signal on line 62 is low. A p-channel transistor 40 selectively connects a voltage supply VCC to conductor 60. The signal on conductor 60 will be inverted by inverter 38 and will appear on a node 124. Thus, if conductor 60 is high, node 124 will be low and will cause conductor 60 to be brought up to a full voltage level.

The signal at node 124 is transmitted back into the logic matrix 26 by a river-routed conductor 58, where it makes connection to a horizontal poly gate conductor 68. The signal is once again inverted by inverter 36, and the complement signal $\overline{D}$ is brought back into the random logic array 26 by a river-routed conductor 56, which in turn makes connection to a horizontal gate conductor 70. Finally, the signal is fed into an output buffer 34, and is made available on a primary output line 126.

A further plurality of river-routed conductors 90, 118 and 128 connect respective Boolean circuits disposed in logic array 26 with a lower tile section 130. Tile section 130 is in the illustrated embodiment comprised of a ground line 122 and a voltage supply line 134. Other non-Boolean circuit elements can also be disposed in lower tile section 130, such as clocks and inverters not associated with output buffers. Further non-Boolean circuit elements of a kind normally disposed in upper tile section 48 can be placed in lower tile section 130 according to space considerations. In this way, a closer matching to the horizontal width of the Boolean logic matrix 26 can be attained in the layout of the non-Boolean elements associated therewith.

Note that the tile 44 for static logic expression S and the tile 46 for dynamic logic expression D are sited inside tile section 48 in the same left-to-right order that the gate transistors comprising the Boolean circuits for S and D are sited inside random logic array 26. Since the Boolean circuits for functions S and D are preferably placed in an order that best matches the preferred peripheral locations of circuit 10's primary inputs and outputs, and since tiles 44 and 46 match this order, the complexity of making connections to circuit 10 is minimized.

Figure 2:
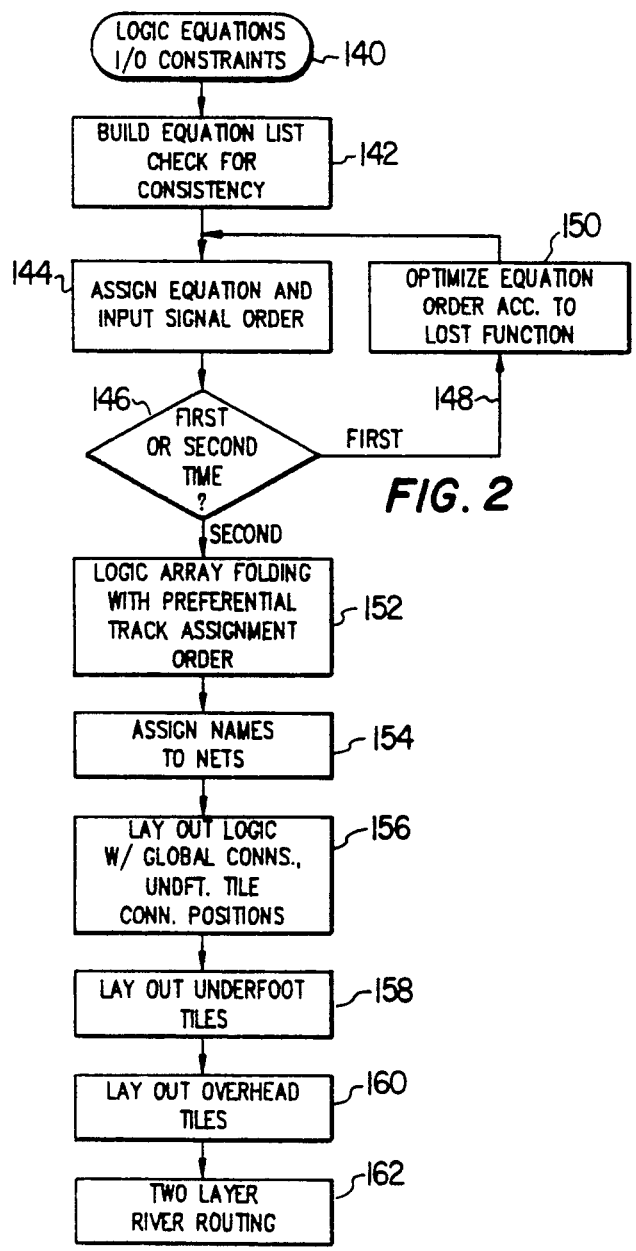
FIG. 2 is a flowchart of a preferably automated layout synthesis process according to the invention.

Turning now to FIG. 2, a flowchart showing the sequence of steps employed according to the method of the invention is shown. In a preferred embodiment, most of the steps of the method are incorporated into a computer program. However, the method could also be accomplished manually.

An overview of the method of the invention will be described in conjunction with FIG. 2. As inputs into the process, a plurality of logic equations or expressions are provided at an initialization step 140. These are preferably in the form of RTL expressions. Each logic equation will have one or more inputs and a desired output. Further, the inputs and outputs of any particular equation may be constrained to appear at a selected point on the periphery of the control logic layout. These input/output constraints are identified with the respective logic equations and are used in subsequent steps of the method.

In a next step 142, a list of the logic equations originated in step 140 is built, and the list is checked for consistency. Each expression is identified according to its type. For instance, there can be static gate equations, registered equations, and dynamic domino logic equations. The registered equations and the dynamic domino logic equations may further be differentiated according to the identify of the clock source on which they are operated.

The method then proceeds to a step 144 which assigns an initial order to the equations, given due regard for the input/output constraints input at step 140. The equation order is conceptually the order of the equations as reproduced in the logic array 26 (FIG. 1), and is a left-to-right order. A signal order is also initiated at this step, the signals being arbitrarily assigned each to a single row or track in the logic array.

At decision point 146, the method asks whether the equation order has been assigned for a first or second time. If the equation order has been assigned for the first time, the program branches on a path 148 to a step 150. In step 150, the equation order is optimized according to a cost function. In this step, each equation is analyzed with respect to its current position inside a symbolic logic array. A cost is assigned to this implementation of the expression according to various selected design criteria, such as those relating to logic array layout area and peripheral interconnection complexity. In the illustrated embodiment, a gate conductor length variable and a primary input/output order are used to assess relative compactness and simplicity of the entire design, as will be described in more detail below.

An input signal, as carried on a single horizontal gate conductor or track, may be used in two or more Boolean circuits or branches thereof. If the Boolean circuits are situated next to each other, the length of the gate conductor can be relatively short, as only the horizontal distance between the farthest two columnar indices of those two logic equations needs to be bridged. If, on the other hand, the two logic equations using this one signal are on opposite sides of the symbolic logic array, the gate conductor length for the input signal that is mutually used by them will be long.

The length of the gate conductor involved is also a measure of the amount of that track that is taken up by that particular gate conductor. If a short length of gate conductor is used, the remaining portion of the track may be used for another gate conductor in a subsequent folding step. If, however, a long gate conductor is used, then the use of that particular track by another gate conductor will not be possible.

Another variable used in the optimizing process is the departure of the primary input/output order from the optimum order. The logic circuitry implemented in one tile section and associated logic array may only be a portion of the circuitry implemented on the chip. The primary inputs and outputs connect the logic circuit block implemented by the program to other components on the chip. Based on the physical relation of these other components to the logic circuit block, the primary inputs and outputs will have optimum entrance and exit points on the top, bottom or sides of the block.

As the order of the RTL logic expressions is shuffled inside the logic block, the entrance and exit points of the primary inputs and outputs will change order. Any departure away from the optimum order increases the cost in area and complexity in connecting the designed logic block to the other components.

The equations are exchanged within the symbolic array in a pairwise exchange heuristic algorithm (to be described in more detail below), and a new value for the cost function of the reordered symbolic array is then calculated. This optimization loop continues until a minimum further improvement in the cost function is obtained.

After step 150 is completed, the equations are once again assigned and ordered at step 144. Step 144 leads back to step 146, which tests again whether this order assignment is for the first or second time. Since this is the second assignment of order time, the program branches to step 152.

In step 152, the symbolic logic array is examined to see whether it can be vertically compacted, that is, compacted in a columnar direction. The gate conductors at this point have been optimized to their shortest lengths given the Boolean circuit requirements of the logic equations and their input/output constraints. As such, these gate conductors may occupy only a small fraction of the particular horizontal track which they initially occupy. The array is therefore restructured or folded, and available empty spaces on certain tracks are "filled" with symbolic gate conductors transferred from other tracks. Thereafter, several symbolic gate conductors will occupy the same track, as spaced from each other end to end.

The method next proceeds to step 154. Equations much more complex than those shown in FIG. 1 may be implemented using the layout method of the invention. Therefore, complex logic equations are broken down into factor expressions. Step 154 assigns names to these factor expressions, or "nets," which yield intermediate results for use in other logic equation branches. Names are given to these "nets" together with vertical and horizontal indices for later connection to upper or lower tiles.

In the next step 156, the symbolic logic array is laid out according to given design rules and the finalized and folded equation order and input signal order. Global connections to other portions of the integrated circuit are laid out, as are connection positions to those tiles that are situated below the logic array, or so-called underfoot tiles.

In step 158, the underfoot tiles are laid out given the underfoot tile connection positions established in step 156. As previously explained, the underfoot tile section will typically comprise inverter, buffer and simple register tiles. The underfoot tiles are preferably chosen such that their inputs and outputs are not primary inputs and outputs, but rather are intermediate signals or "nets". The underfoot tiles are laid out in the same order as the order of respective Boolean logic portions of the equations implemented in the logic array 26.

In step 160, the remaining non-Boolean circuit portions of the logic expressions are laid out in overhead tiles. The overhead tiles are laid out in the same left-to-right order as respective Boolean portions of their logic equations. Each tile may have subcomponents arranged vertically, as will be further described for FIGS. 7 and 8.

Finally, in step 162, both the overhead tiles and the underfoot tiles are connected to the logic array by means of a preferably two-layer river router. The river router employs both polysilicon and first metal conductors. The river routing terminals in the logic array originate from various vertical positions therein to take advantage of free space within the logic array between gate transistors. The river routing will be more particularly described in conjunction with FIGS. 5 and 6.

With the above overview in mind, details of the various steps of the method will be described. In FIG. 3, a logic equation input list for an exemplary layout is shown. The illustrated list is in a form suitable for use as input data for a computer program. This computer program, called RESCUE, is the preferred means of carrying out the subsequent steps of the invention, although the method could be accomplished in whole or in part by hand, or by another computer program.

The list is in RTL format. One of the advantages of the invention arises from the fact that logic circuitry can be laid out using RTL equations as inputs. RTL is a high-level, abstract language that allows the description of both Boolean and non-Boolean attributes of a logic gate in a single equation. Expressing logic in RTL can be done in a much more compact fashion than other logic languages such as "net-list".

In FIG. 3, the logic equations to be implemented are listed under the RTL heading DEFLOGIC. Each equation is defined in terms of its signal name, type, activating clock (if the expression is of the dynamic type), and its input signals. A first type of equation is DEFLATCH, as shown for example at 170, indicating that the equation is of the latched dynamic domino type. The equation name is AL, shown at 172. The name of the clock used to energize the DEFLATCH equation is PH2, shown at 174. Finally, a series of eight input signals that are all inputs into this logic equation are shown at 176. A double slash before an input signal name, such as //EX, indicates that the inverse of the signal is used.

DEFLATCH is a type of dynamic domino gate equation that stores its equation result in a latch, which is part of a register. The tile corresponding to this particular equation will therefore include a sense amplifier or a dynamic precharge clock as well as a latch. All defined equations require an output buffer which, therefore, will be situated in an appropriate tile for that equation.

A static gate logic equation is shown at 178, as identified by DEFEQN. The names of these particular equation types adopted are entirely arbitrary so long as they are distinguished from each other. Static equation 178 has a signal name L. No clock is associated with it, and thus, the equation description starts immediately with three input signals shown at 180. The three input signals are ANDed together. DEFREGISTER Q, at 182, shows a Boolean combination of OR and AND operations. Input signals R and J are ORed together, as are signals Q and U. Note that one of the input signals of DEFREGISTER Q is Q itself, requiring the feedback of this particular output signal into logic array 26. The clock specified for DEFREGISTER Q is PH1RUN. A DEFREGISTER equation has two latches that need to be implemented in a respective tile, and PH1RUN clocks the first of these. The program will select an alternate run clock, PH2, as the domino discharge clock to be implemented in the logic array.

Another illustrated equation type is DEFCLOCK, as for instance DEFCLOCK V indicated at 184. This is a logic equation of the dynamic domino type that requires a clock. The particular clock used here is PH1, as indicated at 186. A DEFCLOCK type of equation, however, does not need a latch, and thus, its tile will contain a sense amplifier and buffer only.

At 187, a DEFCLOCKL equation having an output signal name AH is listed. A DEFCLOCKL is an RTL equation type that requires the implementation of a gated clock and a latch in a non-Boolean tile. DEFCLOCKL AH specifies a clock signal PH1RUN, which will be used to switch the gated clock. The program selects an alternate run clock, PH2, for clocking a discharge gate in the logic array.

A final illustrated equation type is termed DEFSCANADDREG, as for instance is shown at 188. An equation with this designation is a portion of a parallel scan chain that is incorporated into the upper tile section.

Note that many of the logic equations are interconnected, since the result of one equation may be used as the operand of another equation. For example, DEFEQN L shown at 178 produces a result L that is used as an input signal at 190 in the generation of an equation DEFLATCH LL.

The dynamic types of equations above illustrated may further be differentiated by the clock used to activate them. Thus, there may be two or more types of DEFLATCH equations, and two or more types of DEFCLOCK equations. In general, the use of the various equation type names provides a key to the computer program as to what is required to implement the equation, both in terms of Boolean logic operations in array 26 and the contents of associated tiles in the tile sections 48 and 130 (FIG. 1).

The logic equations illustrated in FIG. 3 have been checked for consistency; equation results used in further equations have been identified, and extraneous, unused equations have been removed. The latter happens when several logic arrays and associated tile sections are fabricated at the same time, wherein a choice of several inputs can be made to implement any particular logic equation. FIG. 3 also lists the output terms by their variable names, in their preferred output order, and further the required input terms in an initial order. The input data set illustrated by FIG. 3 can further specify which inputs are from an overhead datapath, which inputs are from bondpads, and which outputs go to bondpads. These additional data are not shown.

A preferred algorithm according to the invention takes the input data shown in FIG. 3 and first assigns each input signal shown in the equations an arbitrary horizontal track order, initially equations one operand per track. After beginning numerical indices are have been assigned both to the initial equation order and input signal order, an array optimization step is next employed according to a cost function. The equations are ordered in a one-dimensional array as follows:

$$Eq_1, Eq_2, Eq_3, \ldots Eq_{J+1}, \ldots Eq_{J+D}, \ldots Eq_n,$$

where $Eq_i$ is the ith equation in an array of n equations.

A cost function is originally determined for the original equation order. One such cost function C may be expressed as follows:

$$C = \sum_{i=1}^{n} l_i^2 + w \sum_{j=1}^{m} (Do_j)^2$$

In the above cost function, n is the total number of horizontal input signal tracks required to implement the logic array in the desired order; $l_i$ is the length of the ith track; W is a scalar weight to be attached to the ordering cost relative to the horizontal track cost; m is the number of input and output signals; and $Do_j$ is the signal ordering cost for the jth input or output. $Do_j$ may be quantized as the number of places that a primary input or output j is displaced from its preferred position in the currently considered configuration.

After an initial cost C is obtained, a pairwise exchange heuristic algorithm is employed in order to attempt to reduce the value of the cost function as far as possible. Starting with the original equation order indicated in FIG. 3 above, pairs of equation are switched in their left-to-right order in the symbolic array, and the cost function redetermined. The first loop in this exchange procedure is to exchange equation J with equation D from $(\frac{2}{3})n$ down to one. Variable J is initially selected as one, and D is initially chosen preferably as equal to $(\frac{2}{3})n$, where n is the total number of equations. These two equations are then exchanged, and the cost function recalculated. If new value of C is less than the current value of C, the switch in order is made permanent. J is then incremented to two and D is incremented to D+1. This process repeats until D+J is equal to expression n.

During the next pass, the difference between D and J is reduced by one, and the process repeated. Subsequently, D is slowly reduced to one as the algorithm runs. This heuristic procedure promotes clustering at the beginning and does local optimization toward the end. The procedure is then repeated with a smaller initial D until no further cost reduction is obtained, or until the improvement in cost reduction goes below a predetermined minimum.

Turning now to FIG. 4a, a two-dimensional symbolic array corresponding to the logic array to be implemented (FIG. 6) is shown. The equivalent of this array is produced, preferably by a computer, after the optimum equation order has been determined by the above-described pairwise exchange heuristic algorithm and the input signal folding step (described below) has been accomplished. The array illustrated by FIG. 4a is a human-readable version of the data actually stored in the computer. A two-dimensional array is plotted out with the gate conductor tracks proceeding from top to bottom, and the input/output conductors proceeding from left to right. In the final physical array, the gate conductor tracks are disposed horizontally.

The array in FIG. 4a has 34 left-to-right columns, each associated with an output signal name. The array further has 15 top-to-bottom rows that each correspond to a possible numerical gate conductor position. The location of transistors or first-metal-conductor-to-poly-track contacts in the symbolic array are indicated by "1"s, "I"s, "$\phi$"s and "0"s. The gate conductor tracks in between the transistors and contacts are represented by exclamation points. In each position where a dash appears, no gate conductor or transistor is formed.

The symbolic array in FIG. 4a shows the numerical, two-dimensional order of the array before the physical attributes of the logic array, such as transistor pitch, conductor widths, spacing, etc. are considered. As an example, one gate conductor track has been circled at 200. Gate conductor 200 begins in column 18 and ends in column 30. A first transistor is formed at column position 18. A contact to a first metal conductor is formed at column position 27. A last transistor is formed at column position 30. The entire gate conductor 200 is disposed in a track No. 5, which also contains another gate conductor for a different input signal or operand.

The transistor and contact symbols are coded according to whether they are the last transistor or contact on the respective poly track, and further according to whether an input signal or its inverse is used. Conductor 200 uses a non-inverted input signal and thus, the transistors and contacts thereon are represented by "1"s and "I"s. The first transistor and the contact are represented by the numeral "1"s, and the last transistor is indicated by an "I". A gate conductor that uses an inverted input signal or operand is shown circled at 202. This conductor runs from column position 8 to column position 17. Two transistors are formed over its length, at column positions 13 and 17. A contact to first metal is made at column position 8.

Conductor 202 occupies track position 8 which it shares with another conductor spaced therefrom. For gate conductors using inverted input signals, the first and intermediate transistors and contacts are indicated by "$\phi$"s and a last transistor or contact on the poly track is indicated by an "0".

Each column 0-34 represents an initial first metal vertical or columnar track order position. At each columnar position, a preferably first metal conductor may be provided for the interconnection of one or more transistor current paths in that column. In Column 2 for example, a conductor termed Q DEFREGISTER OUT FIRST-OR-TERM makes connections to transistors at track positions 0, 3 and 4. Note that the fabrication of an OR term takes two columns: a second OR-TERM for signal Q is disposed in column 3, and makes corrections to transistors at track positions 6 and 7.

The procedure has by this point distinguished between the original logic equations or signals and such variations of them as are necessary to be implemented in individual columnar conductor tracks. Thus, at column positions 10 and 11, two variations of signal AH are shown. Both are outputs from the logic array as indicated by the code "OUT". In column 10, a FIRST-OR-TERM conductor for signal AH makes connections to transistors at track locations 0, 1 and 4; in column 11, a LAST-AND-TERM conductor for signal AH makes connections to transistors at track locations 6, 7 and 9. The FIRST-OR-TERM and LAST-AND-TERM codes determine how the connections to the transistors will be made in the physical array, and the relationship of the two AH conductors to each other. AH DEF-CLOCKL LAST-AND-TERM will actually make further connections to the transistor located at column 10, tracks 1 and 4, but these transistors have already been specified as attributes of AH DEFCLOCKL FIRST-OR-TERM.

Equation Q has been implemented in column positions 2 to 4. The DEFREGISTER legend on columns 2 and 3 indicates that the columns are used to construct a Boolean portion of an equation that includes two latches in a tile. The OUT legend on column 2 indicates that this columnar conductor carries a primary output. The FIRST-OR-TERM legend indicates that this is the first column used to implement a first of the two OR expressions (in particular, R+J; see FIG. 3) used to define equation Q. Column 3 is used to define another branch or OR-TERM of this equation.

Column index 5 is occupied by a columnar conductor carrying signal R. The TRUE legend indicates that this input signal is uninverted. The FROM-TOP legend indicates that this signal proceeds directly from the top of the tile section as a primary input.

At column index 8, signal ML is indicated as having been inverted by the NIL legend. The NIL-FROM-BOTTOM and CBINV legends indicates that a columnar conductor segment in this column position is connected from an inverter located in a bottom tile section. This conductor makes a contact to a gate conductor at 202 on track 9.

The remaining column indices are occupied by other columnar conductors having similar designations as to their signal source and type and whether the signal is inverted.

In the illustrated example, rows 0-9 are occupied by various horizontal gate conductors of a first gate array with transistors disposed along the lengths of the horizontal tracks at determined positions. FIG. 4a also shows a second array whose sole horizontal conductor track is shown on row 15. The second array is used to connect selected overhead tiles with each other and does not decode any Boolean logic. The second array is usually formed as a plurality of second metal row tracks that connect to two or more columnar first metal conductors.

In row 15, the "1" indicates a first connection by a first metal conductor to a second metal horizontal track, and the "I" represents the last connection to the second metal track. The second array is disposed as closely to that tile section containing the tiles it connects as possible. This tile section is conceptually off to the right of the symbolic array.

In the symbolic array shown in FIG. 4a, the second array is arbitrarily distanced from the main logic array by a number of empty rows 10-14. The mapping of this second array outside the overhead tile section 48 (FIG. 1) gives an advantage in providing a router between overhead tiles without the redesign of those tiles. The second array may be folded like the first, logic array, such that two or more second metal horizontal conductors may be disposed on the same horizontal track. While the illustrated second array uses only one horizontal track, as many tracks as are necessary may be used.

FIG. 4b illustrates the rest of a human-readable version of the symbolic array that is preferably stored in the computer at this point. It is a listing of the input signals carried by the gate conductor and second metal conductor tracks that are shown in FIG. 4a. Thus, for example, at track position 4, an input signal R starts at column index position 2. This horizontal track position is also shared by an inverse of input signal H, the gate conductor for which starts at column index 10. Thus, the listing shown in FIG. 4b identifies each gate conductor represented in FIG. 4a. The last horizontal track, 15, is a second metal track that carries a signal N. This track is in the second array.

FIGS. 4a and 4b together illustrate the use of input signal folding, wherein several input or operand signals occupy the same horizontal track index. At gate conductor track 0, a gate conductor for input clock signal PH2 runs almost the entire length of the logic array from a transistor at column index 2 through a transistor at column index 33. At track 7, a gate conductor for input signal Q shares the track with gate conductors for input signals LL and I. One module of the program looks for opportunities to "squeeze" or "fold" the array gate conductors once the equation order have been finalized. Thus, the gate conductors for input signals Q, LL and I originally occupied different symbolic tracks. The program recognizes that no overlap in columnar position occurs among the gate conductors for these three input signals, and therefore "folds" them into one track.

The folding step is preferably performed as follows. The gate conductors are first segregated into four groups conductors that are constrained to occupy preselected track indices and cannot be moved to another track; conductors that are preferentially placed near the bottom of the logic array, such as those carrying discharge clock signals for dynamic logic equations; conductors that are preferentially placed near the top of the logic array near the overhead tile section, such as conductors carrying so-called "precharge through" signals that arrive earlier than normal; and the remainder of the conductors. The track-constrained conductors are next placed into the symbolic array.

The bottom-preferring conductors are then sorted according to their length. The longest bottom-preferring conductor is placed on the bottommost available tract. The bottommost available track is one which has no track-constrained conductor in it that overlaps or intersects the columnar indices of the longest bottom-preferring conductor. In deciding whether there is an intersection of conductor columnar indices, provision is made for spacing the conductor ends apart.

Then, the second longest bottom-preferring conductor is placed. If this conductor has no columnar intersection with either the longest conductor or any track-constrained conductor occupying the bottom track, then it is placed on the bottom track. If an intersection on the bottom track exists, then the program searches for the next lowest track that has sufficient space for this second-longest conductor. This process repeats for the third and subsequent bottom-preferring conductors, filling the logic array from the bottom toward the top.

Next, the top-preferring conductors are placed in the array in a similar manner, but this time from the topmost array track to the bottom. Finally, the remaining gate conductors are placed into the array using a procedure similar to that used for the bottom-preferring and the top-preferring conductors. The direction of fill for the remaining conductors may be either top-to-bottom or bottom-to-top. If there are any unoccupied tracks in the middle of the array after this step, they are eliminated.

Once the symbolic array represented in FIGS. 4a and 4b has been obtained, actual physical design parameters and rules are applied to the symbolic array to produce a plan design of a corresponding physical logic array. These physical parameters include transistor size and spacing, contact spacing, conductor widths and tank dimensions. The logic array is then plotted out. Preferably, the symbolic array shown in FIGS. 4a and 4b is used as a basis to form three further arrays within the computer memory: a transistor array for defining the limits of transistor sources and drains, tanks and gate conductors, a contact array, and a first metal columnar conductor array.

In mapping out the logic array using actual physical parameters, there may be some slight changes away from the positions indicated in the symbolic array because of the physical constraints. Once the physical random logic array has been determined, respective tiles for each equation and equation branch are mapped into the overhead and underfoot tile sections in a left-to-right order. This left-to-right order is compatible with the order of the Boolean portions of the logic equations in the logic array. Then, the river routing is implemented between the logic array and the tile sections. Lateral connections of the river routing are placed among the gate conductors of the logic array, and between the logic array and the second array. The routing starts with the design parameters necessary to define it in an X, or horizontal, direction, but begins in an undefined state in the Y or columnar direction. It is then squeezed down in the Y direction toward the logic array in order to reduce its vertical dimension as far as possible. This completes the fabrication process of the entire control logic circuit.

FIG. 5 illustrates a plan view in outline of a completed control logic circuit that is indicated generally at 210. This control logic array corresponds to the input data set illustrated by FIG. 3, and the symbolic array illustrated by FIGS. 4a and 4b. The control logic circuitry 210 is comprised of a logic array 212, an overhead tile section 214, and an underfoot tile section 216. A river routing section 218 is shown that connects the logic array section 212 with the overhead tile section 214. A similar river routing section 220 connects selected points in the logic array 212 to the underfoot tile section 216. River routing sections 218 and 220 each comprise a plurality of polysilicon and/or first metal conductors 222. Note that the conductors 222 do not make connection merely to the edges of logic array 212, but instead to selected points within logic array 212.

Logic array 212 has sited within it a plurality of transistors 224. Over each transistor 224 travels a polysilicon gate conductor (not shown) that is disposed in parallel horizontally with like gate conductors. These polysilicon gate conductors will be more completely described in conjunction with FIG. 6.

Overhead tile section 214 incorporates a plurality of elongate tiles 226. Each tile 226 comprises the non-Boolean circuitry necessary to effect a respective logic equation whose Boolean component has been mapped into logic array 212. One kind of tile, as is illustrated at 228, incorporates a plurality of custom-designed transistors and interconnections therebetween. The interior details of tile 228 and like tiles are not shown; a tile subsection 230 showing typical interior structure is more particularly illustrated by FIG. 8. Other tiles may consist only of a single conductor, as are indicated at 232. Conceptually, a tile is any structure that takes up area within a tile section such as section 214 or 216.

In the case of tile 232, the actual tile is comprised of a conductor and the space on either side of it to space it from like conductors and other circuit structures. A single-conductor tile 232 is usually associated with a TRUE FROM-TOP input signal as shown in FIG. 4a. For purposes of clarity, not all tiles in tile sections 214 and 216 have been shown.

It has been found that certain circuit structure inside the tiles can be duplicated in pairs at a savings in horizontal space, and thus, for example, tile 228 may be paired with a tile 234 on its lower half, and a tile 236 near its upper end. Tile 228 is itself composed of four circuit sections. A sense amplifier or dynamic precharge clock 230 is disposed near the bottom of tile section 214 adjacent logic matrix 212; a first register portion 238 is disposed next above portion 230; a second register portion 240 is placed next above first register portion 238; and an output buffer section 242 is placed next above section register 240. While these various circuit components are in this instance grouped as a single tile 228, it is also possible to dispose of them in spaced relationship and interconnect them with one or more conductors. In this manner, it is possible to achieve a better efficiency of area use within tile section 214.

Tile section 214 incorporates both serial and parallel scan chains. A parallel scan chain is shown at 244. This is a conductor that connects selected circuit structure inside tiles 226 for the purpose of testing their functions.

A plurality of conductors 246 are also shown that connect selected tile portions together in series. Conductors 246 and the circuit components that they interconnect form a serial scan chain that is designed to test the operation of selected elements of the control logic circuit, such as registers or memory elements, in series. Both the serial scan chain 246 and the parallel scan chain 244 are incorporated into the overhead tile design automatically by the computer program of the preferred embodiment. Circuit structure for the parallel scan equations described for FIGS. 2 and 3 is also incorporated into overhead tile section 214 rather than in the logic array 212.

In many instances, the overall horizontal dimension of a single tile section 214 will be much greater than the horizontal dimension of the corresponding logic array section 212. In this case, in order to conserve horizontal distance, many functions are put into a bottom tile section 216. Such functions typically include power and ground sources, clock sources and certain inverters, buffers and simple registers for signals to be fed back into logic array 212. It is also possible to put any of the remaining non-Boolean functions into bottom tile section 216 rather than top tile section 214.

Bottom section 216, like top section 214, comprises a plurality of bottom tiles 250 that are connected to the Boolean portions of the respective logic equations through a river routing section 220. Once again, river routing section 220 does not stop at the boundary of logic array 212, but connects to points at various vertical locations within logic array 212.

In essence, the river routing sections 220 and 218 are not confined to the areas outside of logic array 212, but conceptually extend throughout logic array 212 for the purpose of routing conductors. This gives an additional advantage of flexibility for placing the columnar conductors in the most efficient manner.

Bottom tile section 216 further comprises a serial scan chain indicated at 252. Like serial scan chain 246 in upper tile section 214, serial scan chain 252 is designed to test the serial operation of the register function of several circuit components within bottom tiles 250.

Turning to FIG. 6, a detailed schematic magnified plan view of logic array 212 and river routing sections 218 and 220 is shown. Selected details of FIG. 6 are shown in FIGS. 6a–6e, and the structure of these details has been omitted from FIG. 6 for the purpose of clarity. The logic array 212 and the overhead and underfoot tile sections (not shown in FIG. 6) are implemented at a face of a semiconductor substrate or layer 253 such as silicon. The semiconductor substrate 253 is selected to be of a predetermined conductivity type, such as p-type. Within substrate 253, one or more tank regions 251 are formed such that transistors of both conductivity types can be implemented into array 212. In the illustrated embodiment, an n-tank, n-well or n-tub 251 is formed in p-type substrate 253 so that selected p-channel transistors 254–258 may be formed therein. A plurality of other transistors 259–284, 286, 288, 290, and 292 are formed in the remaining p-type area of the substrate 253, and are n-channel.

Figure 6A:
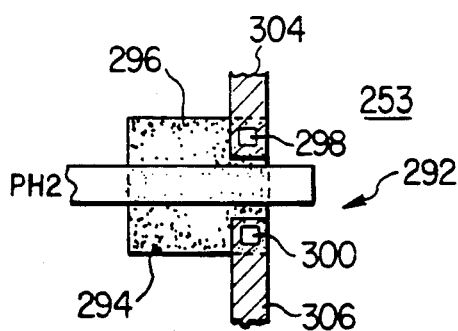
FIGS. 6a-6e are details of FIG. 6 showing various gate transistor configurations.

Each transistor 254–284, 286, 288, 290, and 292 is rectangular in shape and, as isolated from the other transistors, has diffused source and drain of regions of a predetermined size. In an alternative embodiment, a modified computer program is used such that variations in logic array transistor size and other structural details are permitted. In the illustrated embodiment, the transistor size has been chosen to be larger than that absolutely necessary in order to improve the operating characteristics of logic array 212. A detail of a single transistor 292 as formed in logic array 212 is shown in FIG. 6a. The selected transistor is a transistor implemented in the lower right-hand corner of array 212.

A polysilicon gate conductor, in this instance carrying clock signal PH2, is formed across an area including the prospective gate region of transistor 292. Hereinafter, the various conductors will in general be identified by the names of the signals they carry. After gate conductor PH2 is formed, the surrounding area is masked by photoresist and an implantation step is done in order to create a diffused n-type drain region 294 and a source region 296. The polysilicon gate conductor PH2 is spaced from the substrate by a suitable layer of gate oxide (not shown). An overlaying thick layer of oxide is placed on diffused regions 294 and 296 and the surrounding regions. A contact 300 is opened up to drain region 294, and a like contact 298 is opened up to source region 296. First metal conductors 304 and 306 are then deposited, patterned and etched to complete the connections to transistor 292.

In the illustrated embodiment, each poly gate conductor, such as gate conductor PH2, has a predetermined standardized conductor width, as do all first metal conductors such as conductors 304 and 306.

Another advantageous feature of the invention is the way in which contacts 298 and 300 are made to the corners of diffused regions 294 and 296, rather than to these regions' centers. Making contacts to the corners of the transistor in this manner allows space for another contact to another corner, as is shown for transistor 254 (FIG. 6b), or allows another first metal columnar conductor to pass over a non-contacted area of the transistor.

Figure 6B:
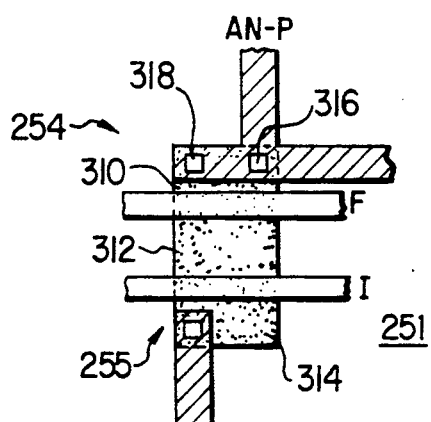

FIG. 6b is a detail of FIG. 6 showing a pair of transistors 254 and 255. This FIGURE shows how the computer program is able to identify transistors that may be fused in a vertical or columnar direction. A first transistor 254 is comprised of a source region 310 and a diffused region 312 that acts as its drain. Transistor 254 is activated by polysilicon gate conductor F. Transistor 255 is comprised of a drain region 314, and diffused region 312 which in this instance acts as transistor 255's source. Transistor 255 is activated by a signal on polysilicon gate conductor I.

FIG. 6b also shows how contacting the corners of transistor 254 allows for more than one contact to be made. In this instance, a pair of contacts 316 and 318 are made to the source region 310 of transistor 254. Also, note the preferred layout technique of having the edges of first metal conductor AN-P be congruent with the diffused region boundaries of transistor 254 wherever possible. Each transistor such as transistors 254 and 255 normally occupy a space over which two first metal conductors can be run as laterally spaced from each other. In this embodiment, each column index equals a first metal conductor width plus spacing on either side. Two such column indices equals a transistor width plus spacing between it and other transistors. The row spacing of an isolated transistor is large enough to allow for first metal/diffusion contacts. In the case where a drain of a first transistor and a source of a second transistor are the same node, the two diffusions are merged and the spacing between them eliminated.

Figure 6C:
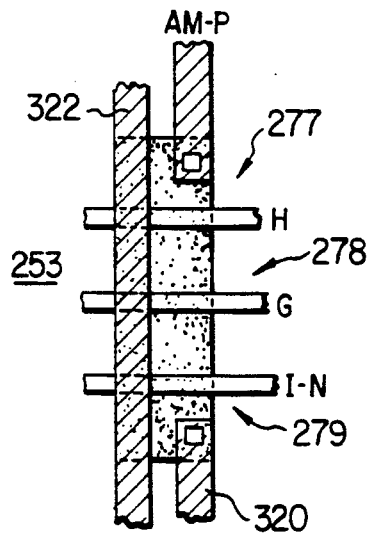

In FIG. 6c, a further detail of FIG. 6 is shown, in particular illustrating combined transistors 277, 278 and 279. These are activated respectively by gate conductors H, G and I-N. As in transistors 254 and 255, transistors 277, 278 and 279 share a diffused region between each pair of them, thus allowing the vertical compaction and fusion of the transistors 277–279. First metal conductor AM-P makes contact to the upper right corner of transistor 277, and a first metal conductor 320 makes contact to the lower right corner of transistor 279. The placement of the contacts over to one side in the transistor structure allows the overlay of a first metal conductor 322 on the other side of transistors 277–279. Additional space for routing the first metal conductors is thus obtained.

Figure 6D:
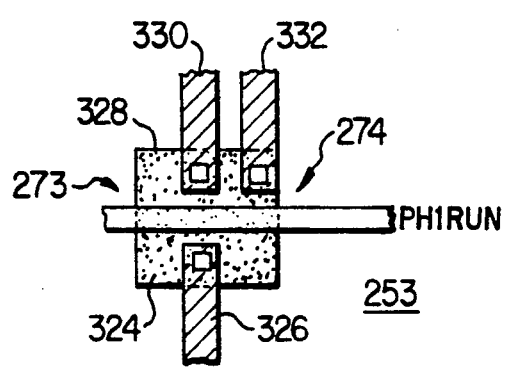

FIG. 6d is a further detail of the random logic array 212 shown in FIG. 6, showing the horizontal merging of two transistors 273–274 that are both activated by clock signal gate conductor PHIRUN. Through its pairwise exchange heuristic algorithm, the program has the capability of sorting out and placing together various logic equations and branches thereof that use the same input signal as one of their operands. When transistors end up placed next to each other, the preferred program inspects whether or not these transistors may be horizontally merged, and still maintain the same logic function. The preferred program tests to see that this merger will not create a sneak path in the logic before finalizing this design modification. Merged transistors 273 and 274 share a combined source region 324 that is connected by a first metal vertical conductor 326 to ground. Transistors 273 and 274 further share a drain region 328 that has more than ample space for the connection of a pair of first metal conductors 330 and 332. Since transistors 273 and 274 do not need to be horizontally spaced from each other, this space is deleted and the two branches of respective logic equations can be squeezed closer together in a horizontal or row direction. The two branches can be from the same or different equations. Additional space is therefore advantageously provided for the routing of other first metal conductors.

Figure 6E:
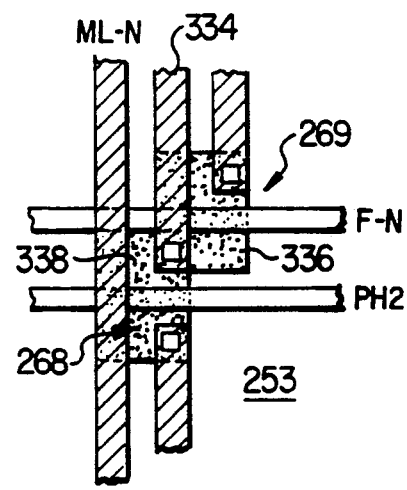

The detail shown in FIG. 6e illustrates the formation of transistors 268 and 269, which are allowed to merge on one corner. The preferred program is able to ascertain a node or common connection to a first metal conductor between adjacent transistors, as transistors 268 and 269 make a common connection to first metal conductor 334. This recognition occurs even though conductor 334 makes connection to the effective source region 336 of transistor 269 and also to the effective drain region 338 of transistor 268. The resultant merger of transistors 268 and 269 occurs both in the horizontal and vertical direction, saving space in both of these directions.

FIG. 6e also illustrates the use of unused space over transistor 268 for the insulative overlay of a first metal conductor ML-N. Further, in a preferred embodiment, each transistor is sited such that its upper and lower limits do not extend further than adjacent poly gate conductor tracks. Thus, the lower limit of transistor 269 is spaced in a regular manner above polysilicon track PH2, and the upper limit of transistor 268 is spaced below polysilicon track F-N.

On the left side of logic array 212 of FIG. 6, a succession of transistors 262, 263, 260, 261 and 259 are all gate transistors for a Boolean portion of a logic equation. This logic branch evaluates output signal Q-P, as shown carried by a respective first metal conductor Q-P that makes connection to transistors 262 and 263. The input signals used by this branch are, from top to bottom, Q-F, U, R, J, and PH2. The Boolean logic expression being evaluated is Q-P=PH2(R+J)(V+(Q−F)), and is the implementation of the Boolean portion of the DEFREGISTER RTL equation shown at 182 in FIG. 3. This leftmost logic branch illustrates that the transistors making up a single Boolean logic portion do not strictly have to be stacked on top of each other, but may be modified according to the needs of the first metal conductor routing and poly track length minimization.

In the illustrated example, all connections to the poly gate conductors are made through river routing conductors from either the top tile section 214, or from the bottom tile section 216. The preferred program allows the routing of the first metal routing conductors to various points within logic array 212 rather than just to the logic array boundary. For example, on the left side, a first metal river routing conductor KL-FN makes connection through a via to a poly gate conductor of the same name approximately in the middle of the array. Thus, for river routing purposes, the river routing module of the program treats the entire array as available space for its river routing needs rather than river routing sections 218 and 220 by themselves. The connections can be made well into the interior of array 212, either from the top section 214 or the bottom section 216. An exemplary connection from bottom section 216 is shown by first metal conductor ML-N which passes over transistor 268 (FIG. 6e) to connect to a gate conductor of the same name through a suitable via.

The program is also capable of determining where horizontal first metal conductor connections should be made in order to implement various Boolean logic operations. For example, transistors 254 and 255 (FIG. 6b) and transistors 283 and 284 (FIG. 6) are all used to implement a dynamic logic expression that outputs a signal AN-P. In order to implement this dynamic expression, transistors 254 and 255 need to be within n-tank 251, and transistors 282 and 284 need in the regular p-type substrate 253. A horizontal section 340 in the first metal is implemented in order to connect these two branches together.

Note also how one single n-tank 251 is used to implement both one set of transistors 254 and 255 (FIG. 6b) and another set of p-channel transistors 256, 257 and 258 lower in the array. The preferred program is able to recognize the use of p-channel transistors in any Boolean logic branch, and groups them together where possible in a single n-tank. Space in a horizontal or row direction is therefore saved, since each n-tank, as n-tank 251, must be sufficiently spaced from surrounding n-channel transistors.

In order to obtain proper operation of p-channel transistors 254 and 255 (FIG. 6b) and transistors 256, 257 and 258 (FIG. 6), it is necessary to contact the semiconductor substrate inside n-tank 251 to VCC. This accordingly is done through a via 344. The program is able to discern the requirements of such a via and an associated first metal conductor 346.

Several of the advantages of the invention lay in its use of a double-layer river routing, as especially shown in upper river routing section 218. The connections between the upper tiles in tile section 214 and respective Boolean logic portions within logic array 212 can be made either by first metal conductors, such as input signal KL-FN on the extreme left, or through polysilicon conductors, as is the case of input signal H on the extreme right. A provision of two layers of river routing insulated from each other allows the river routing to typically be four times as compact as the conventional single-layer river routers heretofore used.

It is therefore possible to employ the same columnar index for both a polysilicon river routing conductor and a first metal river routing conductor. One example of this is shown toward the middle of the array, where a polysilicon conductor is used to carry signal J-FN, and a first metal conductor is used to carry a signal J. At length 348, the poly conductor J-FN underlies poly conductor J, and these two conductors continue to occupy the same area in plan view for some distance. The polysilicon river-routing conductors, such as J-FN, are suitably insulated from the first metal river-router conductors, such as J, by an insulator layer such as oxide.

As indicated in FIGS. 3 and 4a, the program distinguishes between an original input or output signal and branches or variants of this signal as may be used in the actual logic array 212. Thus, for example, the input data set shown in FIG. 3 specifies a signal AM as the output of a DEFCLOCK RTL equation. A corresponding polysilicon river routing conductor AM-P is disposed toward the center of array 212. Signal AM-P is not synonymous with signal AM, but is rather a precursor of it before processing through a register, buffer or like non-Boolean circuitry.

The first metal river-routing conductors have suffixes that describe their origins. For example, the leftmost first metal river-router conductor KL-FN carries the FN suffix to indicate that it is a feedback signal that further is inverted before being reintroduced into the array. Further into the array from the right, a first metal conductor ML-N from the bottom indicates that this signal originates from an inverter.

In the upper left hand corner of array 212, polysilicon conductor AM-P is notable for its connection to a first metal conductor 350 at a via 352. The river routing module is able to freely mix the conductor types, switching from one conductor over to another where this is convenient. As a further example, polysilicon conductor AJ-P, at the top and third in from the right, is changed over to a first metal conductor 354 at a via 356. The changeover at this point then makes possible the underlying of a polysilicon river-routing conductor H for a selected vertical distance.

The logic array 212 as so far described has all of its inputs and outputs to either its top or bottom sides. However, input and output signals may also originate from the sides of the array 212 through horizontal second metal conductors 358 and 360, only two of which are shown in phantom for purposes of clarity. Each second metal conductor 358 and 360 is suitably spaced over the remaining illustrated structure such as by a layer of oxide, except where vias to the first metal are made. In FIG. 6, second metal conductor 360 is used to carry the PH2 clock signal from either side of logic array 212 to a via 362, where it makes contact to a short section 364 of first metal. The first metal section 364 in turn makes a via at 366 to horizontal poly gate conductor PH2, which is used to activate a series of transistors 259, 268 (FIG. 6e) and 292 (FIG. 6a) along its length.

Second metal is also used to implement a ground pad 368, from which a plurality of vias 369 are made to selected first metal conductors dropping from array 212. A voltage supply or VCC metal rail 370 also has a via 372 from it for connection to various other first metal conductors. Further second metal conductors (not shown) can be used to feed signals through array section 212 entirely without any connection thereto at all.

As in upper river routing section 218, first metal conductors in lower river routing section 220 can change over to polysilicon and back as circumstances dictate. Thus, at via 373 toward the bottom center, a first metal conductor carrying primary input F changes over to poly, which is laid out underneath a first metal conductor carrying an inverted feedback signal F-N.

In the upper left hand corner of array 212, a first metal conductor 374 and a first metal conductor 376 both carry a signal N. Conductors 374 and 376 are connected to a horizontal second metal conductor 378 through respective vias 380 and 382. Second metal horizontal conductor 378 is an extremely simplified version of a "second array" that can be implemented into array 212. As previously mentioned, this second array has no transistors or gate conductors, but is implemented into array section 212 for the cross-connection of one tile in the upper tile section 214 to another therein. The institution of this "second array" within array section 212 allows further flexibility in the arrangement of interconnections between the tiles in the tile section, since the conductors between the tiles do not have to be custom-designed.

FIG. 6 also demonstrates the leftward compaction employed when plotting the physical array from the symbolic array. In FIG. 4a, a DEFCLOCKL AH RTL function occupies two columns 10 and 11, in which six transistors are specified. In the physical array 212 (FIG. 6), this vertical placement is shoved leftwards as far as space will conveniently allow. The transistor 264 that senses input signal AI is leftwardly displaced from the top columnar position of poly conductor AH-P. Transistors 265 and 266 are disposed below transistor 264, but transistor 267 (sensing the value of input signal 11I) is jogged further to the left by one column index.

The design style of the invention designs a logic circuit comprising a logic array, an upper tile section, optionally a lower tile section, and poly/first metal river routing connecting these components. The logic circuit can be abutted on its sides by other logic circuits designed in a similar manner. Signals that are used in more than one logic circuit, or "global" signals, advantageously use the horizontal second metal conductors that overlie each array section and each tile section. The primary inputs and outputs at the top of the circuitry can also be used to connect to another logic circuit designed in a similar style.

Referring now to FIG. 7, a logical and schematic diagram of tile 228 (FIG. 5) is shown. The circuit elements shown in FIG. 7 are identified with the same numbers that identify their respective physical counterparts in FIG. 5 wherever possible. A first module of tile 228 is the sense amplifier and precharge clock 230, which is physically located closest to random logic array 212 (FIG. 5). Amplifier 230 has a PH2 clock input and a Q-P signal input, and outputs an inverted signal on line 390 to a latch module 238. In addition to the regular signal input at 390, latch module 238 has a serial scan chain input 392. Any signal appearing on scan chain line 392 is clocked with the aid of a clock signal PH2SCAN. The regular input signal appearing on 390 is clocked with PH2RUN.

An output 394 of the first latch is split and input into a second latch 240. The second latch 240 has another serial scan clock PH1SSCANADV for clocking a scan signal through latch 240, and further has a clock signal input PH1RUN to clock a regular signal through latch 240. Latch 240 has an output 396. One branch of output 396 becomes the input of an output buffer 242, which outputs primary output signal Q. Another branch of second register output 396 is fed back to logic array 212 (FIG. 5) as a feedback input signal Q-F on a return conductor 398.

Figure 8:
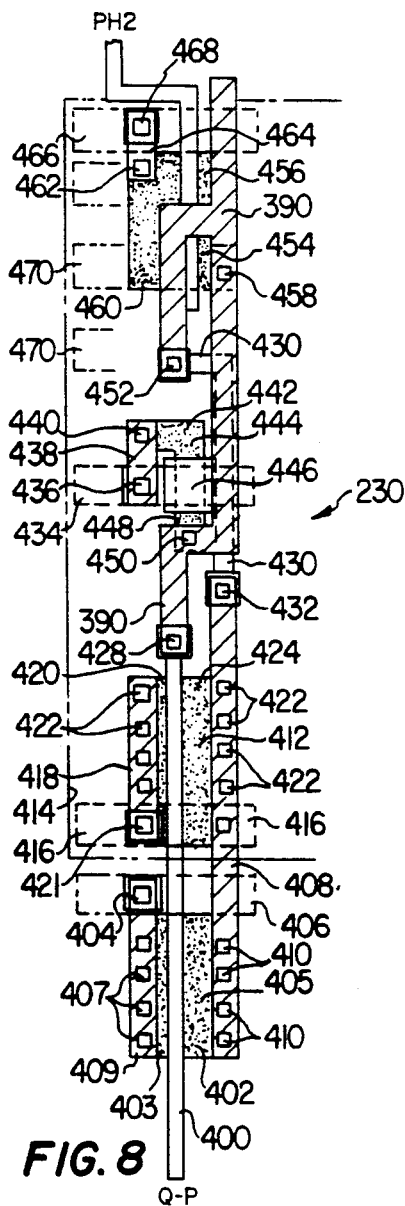
FIG. 8 is a magnified schematic plan view of a tile from the tile section shown in FIG. 5, and corresponding to the circuit diagram shown in FIG. 7.

Turning now to FIG. 8, the sense amplifier portion 230 of title 228 (FIGS. 5 and 7) is shown in magnified plan view. Like numbers identify like parts whereever possible. Tile portion 230 illustrates the use of non-regular transistors and other components in a custom designed tile to be used in conjunction with the invention. Tile portion 230 takes an elongate shape stretching from an input Q-P on a polysilicon gate conductor 400 at the bottom, to a primary output line 390 at the top that is implemented in first metal. The elongate shape of tile portion 230 is chosen in order to best match the horizontal dimension of the Boolean logic portion in connection with which it is implemented.

Signal Q-P is output from logic array 212 (FIG. 6) and becomes the gating signal for a large, n-channel transistor 402. A source region 403 of transistor 402 is connected through a plurality of contacts 407, a short first metal conductor 409 and a via 404 to a horizontal second metal ground connection 406 that runs across the entire tile section 214 (FIG. 5). All second metal conductors herein are shown in phantom for purposes of clarity. A drain region 405 of transistor 402 is connected to a vertical first metal conductor 408 through a plurality of contacts 410.

A large p-channel transistor 412 is formed within an n-tank region 414, only a portion of which is shown. N-tank 414 preferably extends across the entire tile section 214 for disposal of other p-channel transistors therein. The placement and arrangement of the tiles within tile section 214 are made such that the number of such tank regions is minimized. This in turn reduces spacing requirements.

Like transistor 410, transistor 412 is gated by poly conductor 400, and selectively connects a voltage supply VCC provided on horizontal second metal conductor 416 to the first metal conductor 408.

Second metal conductor 416 is connected to a first metal conductor 418 through a via 421, and a plurality of contacts connect second metal conductor 416 to a drain region 420 of transistor 412. As in transistor 402, a plurality of contacts 422 connect a source region 424 of transistor 412 to first metal conductor 408. P-channel transistor 412 and N-channel transistor 402 act as a CMOS pair.

Above transistor 412, poly gate conductor 400 is connected to a vertical first metal conductor 390 through a via 428, and first metal conductor 408 is connected to a poly conductor 430 through a via 432. A further second metal voltage supply rail 434 is connected through a via 436 to a short first metal conductor segment 438. This in turn is connected through a contact 440 to a drain region 442 of a relatively weak inverting transistor 444. Inverting transistor 444 is gated by an extension 446 of polysilicon conductor 430, which is through most of its length shown in phantom beneath first metal conductor 390. A source region 448 of transistor 444 is connected to first metal conductor 390 through a contact 450.

Polysilicon conductor 430 joins up with first metal conductor 390 at a via 452. A source region 454 of a precharge transistor 456 is connected to first metal conductor 390 through a contact 458. Precharge transistor 456 is gated by a polysilicon gate conductor PH2 that is input from the top. Poly conductor PH2 eventually connects to another second metal horizontal rail through an appropriate contact (not shown) to a clock source. A drain region 460 of transistor 456 is connected to a short second metal conductor 462 through a contact 464. Conductor 462 in turn is connected to a voltage supply second metal horizontal rail 466 through a via 468. First metal conductor 390 is output to the next portion 238 of tile 228.

The ends of further horizontal second metal conductors 470 are shown in phantom to indicate their relative placement. These conductors 470 do not connect with any of the structure of tile portion 230, but carry signals to other tiles occupying similar vertical positions within overhead tile section 214. Tile portion 230 illustrates the great variance that can be had in transistor sizes, gate formations and numbers of contacts when a custom design is used for the non-Boolean portions of a logic equation. Parameters for a design such as that shown in FIG. 8 are preferably stored in a library from which the operating computer program can select particular tile portions depending on the needs of the logic equation to be implemented. In this way, a control logic array can be quickly designed that uses the best features of a regular logic array and standard cells.

In summary, a comprehensive control logic layout system has been shown and described. The Boolean portions of logic equations are implemented in a regular logic array that is optimized according to a cost function. Once the logic equations have been put into the logic array in a particular order, appropriate tiles are implemented in one or more adjacent tile sections to implement the non-Boolean portions of the logic expressions. The tiles and the array are interconnected with the use of a preferably two-layer river router that can make connections to points well within the logic array.

While preferred embodiments and their advantages have been disclosed in the above detailed description, the invention is not limited thereto, but only by the spirit and scope of the appended claims.

What is claimed is:

1. A random logic circuit for providing full custom design of a layout comprising:
   a logic array which is multiply folded and which includes static gates and dynamic gates, said logic array further including more than two levels of logic;
   a tile section for processing non-Boolean operations, and including routing connections for transfer of signals within and without the tile section; and
   router connections between the logic array and the tile section.

2. A random logic circuit as recited in claim 1, wherein the logic circuit implements a register transfer language description for providing full custom design of a layout.

* * * * *